(12) United States Patent
Kubo et al.

(10) Patent No.: US 7,655,982 B2
(45) Date of Patent: Feb. 2, 2010

(54) OUTPUT CONTROL DEVICE, AND AC/DC POWER SOURCE DEVICE, CIRCUIT DEVICE, LED BACKLIGHT CIRCUIT DEVICE, AND SWITCHING DC/DC CONVERTER DEVICE EACH USING OUTPUT CONTROL DEVICE

(75) Inventors: Masaru Kubo, Nara (JP); Toshio Naka, Mie (JP); Shinji Kamiya, Kyoto (JP); Shohhei Ohsawa, Nara (JP)

(73) Assignee: Sharp Kabushiki Kaisah, Osaka (JP)

( * ) Notice: Subject to any disclaimer, the term of this patent is extended or adjusted under 35 U.S.C. 154(b) by 216 days.

(21) Appl. No.: 12/005,393

(22) Filed: Dec. 27, 2007

(65) Prior Publication Data

US 2009/0033300 A1    Feb. 5, 2009

Related U.S. Application Data

(60) Provisional application No. 60/935,474, filed on Aug. 15, 2007.

(30) Foreign Application Priority Data

Jul. 31, 2007   (JP) .............................. 2007-199981

(51) Int. Cl.
    *H01L 29/735*   (2006.01)
(52) U.S. Cl. ..................................... 257/343
(58) Field of Classification Search ................ 257/557, 257/343, 575, E27.054, E29.031, E29.045
    See application file for complete search history.

(56) References Cited

U.S. PATENT DOCUMENTS

| 4,376,286 | A | 3/1983 | Lidow et al. |
| 5,023,678 | A | 6/1991 | Kinzer |
| 6,977,425 | B2 * | 12/2005 | Yoshida et al. .............. 257/517 |
| 2004/0227547 | A1 | 11/2004 | Shiraishi et al. |
| 2006/0044772 | A1 | 3/2006 | Miura |

FOREIGN PATENT DOCUMENTS

| JP | 63-197358 | 8/1988 |
| JP | 63-197358 U | 12/1988 |
| JP | 2002-280503 | 9/2002 |
| JP | 2004-165269 | 6/2004 |
| JP | 2004-342735 | 12/2004 |

(Continued)

OTHER PUBLICATIONS

CQ Publishing Co. Ltd., Transistor Technology Special. No. 28, pp. 106, Jul. 1, 1991, and partial English translation thereof.

(Continued)

*Primary Examiner*—Shawn Riley
(74) *Attorney, Agent, or Firm*—Harness, Dickey & Pierce, P.L.C.

(57) ABSTRACT

In one embodiment of the present invention, an output control device is disclosed capable of reducing a chip size and realizing a low cost. An output control device includes a switching transistor controlling an output voltage by having an on/off time ratio controlled and a control IC controlling the on/off time ratio of the switching transistor on the basis of the output voltage controlled by the switching transistor. The switching transistor is made of a lateral power MOSFET.

39 Claims, 13 Drawing Sheets

FOREIGN PATENT DOCUMENTS

| | | |
|---|---|---|
| JP | 2006-073655 | 3/2006 |
| JP | 2006-261537 | 9/2006 |
| JP | 2007-110845 | 4/2007 |
| JP | 2007-116012 | 5/2007 |

OTHER PUBLICATIONS

Tsutomu Matsushita et al. "A Surge-Free Intelligent Power Device Specific to Automotive High Side Switches." IEEE Transactions on Electron Devices, vol. 38, No. 7, pp. 1576-1577, Jul. 1991.

* cited by examiner

F I G. 1 3
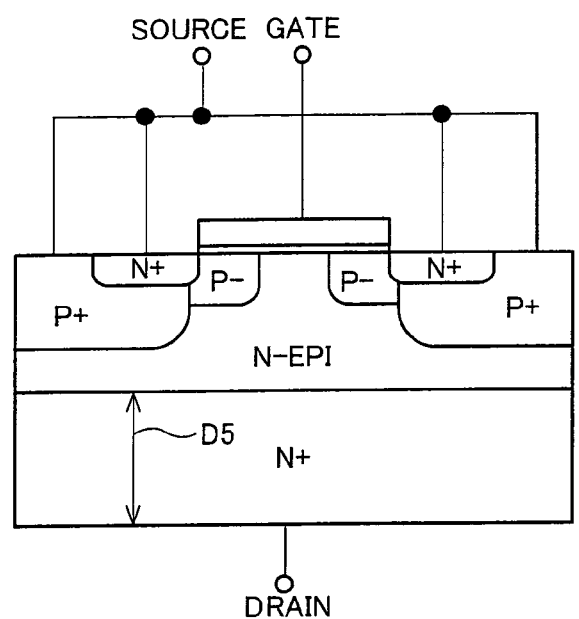

OUTPUT CONTROL DEVICE, AND AC/DC POWER SOURCE DEVICE, CIRCUIT DEVICE, LED BACKLIGHT CIRCUIT DEVICE, AND SWITCHING DC/DC CONVERTER DEVICE EACH USING OUTPUT CONTROL DEVICE

This nonprovisional application claims the benefit of U.S. Provisional Application Ser. No. 60/935,474 filed on Aug. 15, 2007, and claims priority under 35 U.S.C. §119(a) on Patent Application No. 199981/2007 filed in Japan on Jul. 31, 2007, the entire contents of all of which are hereby incorporated by reference.

FIELD OF THE INVENTION

The present invention relates to an output control device including a switching transistor controlling an output voltage or an output current by having an on/off time ratio controlled and a control IC controlling the on/off time ratio of the switching transistor on the basis of the output voltage or the output current controlled by the switching transistor.

BACKGROUND OF THE INVENTION

A switching power source system including a switching element connected to a primary-side circuit and a control IC controlling the switching element is known as a switching power source system that converts a commercial power source to a DC power source for an electric/electronics apparatus. FIG. 1 in page 1577 of Non-Patent Document 1 discloses an example in which such a switching power source system is realized by a combination of a vertical power MOSFET and a control circuit.

Patent Document 1 discloses an arrangement that realizes such a switching power source system with a monolithic IC or one chip by embedding a switching transistor composed of a lateral power MOSFET in a control circuit.

Moreover, in an arrangement disclosed, a control IC and a switching transistor are separately packaged, in a conventional switching power source system. (Non-Patent Document 2)

FIG. 5 of Patent Document 2 discloses an arrangement in which two chips including a control IC chip and a switching transistor chip are arranged in one package. However, because a switching transistor is a vertical transistor in general, a die bonding area becomes a drain (collector). This causes a large potential difference between a potential (generally, GND) of a backside of the control IC and a potential of the drain (collector) of the vertical transistor, in terms of a circuit. Accordingly, it is necessary to insulate the backside of the control IC chip from the die bonding area of the switching transistor. For the insulation, an insulating sheet is provided on the backside of the control IC when the control IC is die-bonded.

Alternately, in a known arrangement, an island of a lead frame is divided, for the purpose of realizing insulation between the backside of the control IC chip and the die bonding area of the switching transistor. The control IC chip is die-bonded on one island. On the other island, the switching transistor is die-bonded. (FIG. 1 and FIG. 2 of Patent Document 2)

FIGS. 1 and 2 of Patent Document 3 disclose an arrangement in which a vertical power MOSFET is fabricated as a discrete MOSFET.

[Patent Document 1]
U.S. Pat. No. 5,023,678, FIG. 5

[Patent Document 2]
Japanese Unexamined Utility Model Publication No. 197358/1988 (Jituskaishou 63-197358), FIGS. 1, 2, and 5

[Patent Document 3]
U.S. Pat. No. 4,376,286, FIGS. 1 and 2

[Non-Patent Document 1]
IEEE Transactions on Electron Devices, Vol. 38, No. 7, July 1991: p. 1577, FIG. 1

[Non-Patent Document 2]
CQ Publishing Co. Ltd., Transistor Technology Special No. 28, All about Latest Power Circuit Design Technologies, p. 106, FIG. 8, issued on Jul. 1, 1991

In an arrangement disclosed in Non-Patent Document 1, a vertical power MOSFET is adopted as a switching transistor. The vertical power MOSFET structurally has a junction field effect transistor (hereinafter, referred to as J-FET) between adjacent bodies. A parasitic J-FET increases an on-resistance of the vertical power MOSFET. In order to decrease the parasitic resistance of the J-FET, a distance equal to or more than 20 μm is necessary between adjacent vertical power MOSFETs. As a result, a gate electrode becomes long. Consequently, a gate capacitance of the switching transistor increases.

For the reason mentioned above, a gate capacitance of the switching transistor increases. Consequently, a large output current from a control circuit becomes necessary for driving the switching transistor. This leads to an increase in a size of an output transistor of the control circuit. As a result, a chip size increases. This causes cost increase. Moreover, because a gate capacitance of the switching transistor increases, the switching transistor cannot deal with high-speed switching.

In an arrangement disclosed in Patent Document 1, a control IC can be fabricated at a low cost by using a fine process that is a low voltage process, because the chip size can be decreased by the process. Meanwhile, a switching transistor requires a high voltage process having a large design rule. Formation of these two devices in one chip requires a process that realizes performances of the both devices. This results in a quite expensive processing cost. As to the number of masks, for example, in a case where the devices are separately fabricated, 13 masks for the control IC and 9 masks for the switching transistor are necessary. However, 17 masks are necessary for fabricating the devices in one chip, and an entire area of the chip needs to be fabricated with this number of masks. This means that both the control IC and the switching transistor are fabricated on the same chip with 17 masks. Therefore, this clearly leads to a cost increase for the one-chip arrangement compared with a two-chip arrangement.

According to an arrangement disclosed in Non-Patent Document 2, each of a control IC and a switching transistor is individually molded in a mold assembly. As a result, a cost becomes high. Moreover, reduction in size becomes impossible.

Furthermore, because wiring provided between the control IC and the switching transistor is long, an inductor component of this wiring causes distortion in a switching transistor drive signal waveform generated by the control IC. As a result, the switching transistor does not function as intended in designing. Consequently, a conversion efficiency of an entire power source circuit deteriorates.

In addition, because of the long wiring between the control IC and the switching transistor, the power source circuit tends to be influenced by noise from other circuit. This causes distortion in a switching transistor drive signal waveform generated by the control IC. As a result, the switching transistor does not function as intended in designing. Consequently, a conversion efficiency of the entire power source circuit deteriorates.

Because of the long wiring between the control IC and the switching transistor, an operation of a capacitance between this wiring and GND requires supply of a current for charge/discharge of the capacitance between the wiring and the GND at the time when the control IC generates a switching transistor drive signal. Accordingly, the control IC needs to have driving ability. This leads to an increase in a consuming power of the control IC and an increase in a chip size.

In an arrangement disclosed in FIG. 5 of Patent Document 2, an insulating sheet is expensive. Moreover, because a control IC chip is capacitively coupled with a lead frame having a voltage amplitude equal to or more than 100V via an insulating sheet, a circuit of the control IC may malfunction.

In an arrangement disclosed by FIGS. 1 and 2 of Patent Document 2, an island to which the control IC chip is die-bonded is GND in terms of a circuit. On the other hand, an island to which a switching transistor chip is die-bonded has a voltage amplitude equal to or more than 100V. Consequently, capacitive coupling between these islands may cause malfunction of a circuit of the control IC. For the purpose of preventing the malfunction, it is necessary to decrease a capacitance between the islands. This requires equal to or more than a predetermined spacing. However, this conventional technique does not teach nor suggest the spacing.

The switching transistor consumes a large amount of power and generates a large amount of heat. However, a rise in a temperature of the control IC should be prevented for stable operation of the control IC. An effect of this conventional technique makes it difficult to transmit heat generated by the switching transistor to the control IC. However, the conventional technique does not teach nor suggest a spacing between the islands which spacing is necessary to obtain the effect.

Moreover, in a case where solution is required for dissipating heat of the switching transistor in a high-capacity power source, it is necessary to expose, from a backside of a package, only the island on which the switching transistor is mounted and connect the island to an external heat dissipation plate. This complicates a frame structure in the extreme and leads to cost increase.

The object of the present invention is to provide an output control device capable of reducing a chip size and realizing a low cost.

SUMMARY OF THE INVENTION

An output control device of the present invention includes a switching transistor controlling an output voltage or output current by having an on/off time ratio controlled; and a control IC controlling the on/off time ratio of the switching transistor on the basis of the output voltage or output current controlled by the switching transistor, the switching transistor being composed of a lateral power MOSFET.

According to the feature mentioned above, the switching transistor controlling the output voltage or output current by having the on/off time ratio controlled is composed of a lateral power MOSFET. In a lateral power MOSFET, it is possible to shorten a gate electrode because a parasitic JFET does not exist. This makes it possible to lower a gate capacitance and reduce an output current of the control IC. Accordingly, it becomes possible to reduce a size of an output transistor provided in the control IC. As a result, a chip size can be reduced and a low cost can be realized.

In the output control device of the present invention, it is preferable that: the switching transistor controls an output voltage of an AC/DC power source.

According to the arrangement, it becomes possible to reduce a chip size of the control IC in the output control device of the AC/DC power source. As a result, a low cost can be realized.

In the output control device of the present invention, it is preferable that: the switching transistor controls an output current of an LED backlight circuit or a circuit having an LED as a load.

According to the arrangement, it becomes possible to reduce a chip size of the control IC in the output control device provided in the LED backlight circuit or a circuit having an LED as a load. As a result, a low cost can be realized.

In the output control device of the present invention, it is preferable that: the switching transistor controls an output voltage of a switching DC/DC converter.

According to the arrangement, it becomes possible to reduce a chip size of the control IC in the output control device provided in the switching DC/DC converter. As a result, a low cost can be realized.

Another output control device of the present invention includes: a switching transistor chip formed to control an output voltage or output current by having an on/off time ratio controlled; a control IC chip formed to control the on/off time ratio of the switching transistor chip on the basis of the output voltage or output current controlled by the switching transistor chip; and a package containing the switching transistor chip and the control IC chip, the switching transistor chip being composed of a lateral power MOSFET.

According to this feature, the switching transistor and the control IC are composed of separate chips, respectively. Accordingly, compared with a one-chip arrangement, a processing cost can be reduced. Moreover, the switching transistor and the control IC are arranged in one package, reduction in size and realization of a low cost become possible, compared with a two-package arrangement.

In the another output control device of the present invention, it is preferable that: the switching transistor chip and the control IC chip are mounted on a same island.

According to the arrangement, compared with a two-package arrangement, temperatures of the switching transistor and the control IC become substantially the same. Accordingly, the temperature of the switching transistor can be detected by the control IC. Moreover, this arrangement can correspond to a frame exposing a backside which frame is capable of favorably dissipating heat.

In the another output control device of the present invention, it is preferable that: a distance dc between the switching transistor chip and the control IC chip satisfies: $dc \geq e0 \cdot em \cdot Sc \cdot (V/Vnc) \cdot BW \cdot Rc$, where: e0 is a permittivity of vacuum; em is a specific inductive capacity of a molding resin of the control IC chip; Sc is a size of an area where the switching transistor chip and the control IC chip face each other; V is a voltage amplitude of the switching transistor chip; Rc is an impedance of a control circuit of the control IC chip; BW is a bandwidth of the control circuit of the control IC chip; and Vnc is a voltage amplitude of noise permissible in the control circuit of the control IC chip.

According to the arrangement, the switching transistor chip and the control IC chip are apart from each other at a distance that satisfies $dc \geq e0 \cdot em \cdot Sc \cdot (V/Vnc) \cdot BW \cdot Rc$. Accordingly, it is possible to reduce transfer of switching noise from the switching transistor chip to the control IC chip.

It is preferable that the another output control device of the present invention further includes: an island mounting at least either one of the switching transistor chip and the control IC chip; and a lead terminal connected to the island.

According to the arrangement, heat generated by the switching transistor chip can be dissipated through the lead terminal connected to the island. Accordingly, heat transfer to the control IC chip can be significantly reduced. The lead terminal for such heat dissipation may be arranged with a dummy (NC) pin.

In the another output control device of the present invention, it is preferable that: the control IC chip includes a digital circuit and an analog circuit that is provided on a side opposite to the switching transistor chip with respect to the digital circuit.

According to the arrangement, in a layout of the control IC chip, an analog circuit susceptible to noise can be set farther apart from a noise source (switching transistor chip) by arranging the digital circuit on a side that is closer to the switching transistor chip.

In the another output control device of the present invention, it is preferable that: the switching transistor chip includes a terminal drawing a drain current, the terminal being provided on a side opposite to the control IC chip.

According to the arrangement, in the layout of the switching transistor chip, the terminal drawing a drain current which terminal is a source causing noise can be provided in a position far from the control IC chip.

It is preferable that the another output control device of the present invention further includes: a lead terminal for grounding the switching transistor chip; and a lead terminal for grounding the control IC chip.

According to the arrangement, a source current of the switching transistor chip can be separated from a grounding current of the control IC chip to a certain extent. Accordingly, it is possible to reduce noise sneaking from the switching transistor chip to the control IC chip via ground.

In the another output control device of the present invention, it is preferable that: the switching transistor chip and the control IC chip are mounted on the same island; and the lead terminal for grounding the switching transistor chip being connected to the island.

According to the arrangement, by connecting, with wire, GND of the control IC chip to a lead terminal that is not connected to the island, it becomes possible to further reduce the sneaking of noise from the switching transistor chip.

It is preferable that the another output control device of the present invention further includes: a transistor island mounting the switching transistor chip; and a chip island mounting the control IC chip, the lead terminal for grounding the switching transistor chip being connected to the transistor island.

According to the arrangement, by connecting, with wire, GND of the control IC chip to a lead terminal that is not connected to the island, it becomes possible to further reduce the sneaking of noise from the switching transistor chip.

In the another output control device of the present invention, it is preferable that: the switching transistor chip is thinner than the control IC chip.

According to the arrangement, Rth of the switching transistor chip can be reduced. In a case of a two-package arrangement, the control IC chip is not influenced by heat generated by the switching transistor chip. However, in a case of a one-package arrangement, because the control IC chip is influenced by heat generated by the switching transistor chip, heat dissipation becomes particularly important.

In the another output control device of the present invention, it is preferable that: a backside of the switching transistor chip is die-bonded with an Ag paste.

According to the arrangement, a current of the lateral power MOSFET flows on a surface of the chip but does not flow on a backside of the chip. Accordingly, it becomes possible to employ an Ag paste that costs low.

In the another output control device of the present invention, it is preferable that: the control IC chip is coated with a resin having a low heat conductivity.

According to the arrangement, it becomes possible to reduce an effect of heat of the switching transistor chip on the control IC.

In the another output control device of the present invention, it is preferable that: the island includes a slit formed between the switching transistor chip and the control IC chip.

According to the arrangement, the slit formed between the switching transistor chip and the control IC chip can realize reduction in transfer of heat generated by the switching transistor chip to the control IC chip. At the same time, one-shot molding with a frame also becomes possible.

In the another output control device of the present invention, it is preferable that: a width of the slit is equal to or more than 0.5 mm.

According to the arrangement, it becomes possible to effectively reduce the transfer of heat generated by the switching transistor chip to the control IC chip.

In the another output control device of the present invention, it is preferable that: the lead terminal for grounding the switching transistor is connected to the island including the slit.

According to the arrangement, it becomes possible to further reduce the noise sneaking from the switching transistor chip by connecting, with wire, the GND of the control IC chip to the lead terminal that is not connected to the island.

It is preferable that the another output control device of the present invention further includes: a transistor island mounting the switching transistor chip; and a chip island mounting the control IC chip.

According to the arrangement, it becomes possible to significantly reduce transfer of heat generated by the switching transistor chip to the control IC chip. It also becomes possible to change a material of the transistor island mounting the switching transistor composed of a lateral power MOSFET to a material having a low heat resistivity.

In the another output control device of the present invention, it is preferable that: a distance between the transistor island and the chip island is equal to or more than 0.5 mm.

According to the arrangement, it becomes possible to significantly reduce transfer of heat generated by the switching transistor chip to the control IC chip.

In the another output control device of the present invention, it is preferable that: the switching transistor chip controls an output voltage of an AC/DC power source.

According to the arrangement, a lead from the control IC chip to a gate of a driven lateral power MOSFET is eliminated and wiring is shortened. This makes it possible to reduce L, C, and R components of the wiring. Accordingly, it becomes possible to reduce a switching loss due to the L, C, and R components, and efficiency of the AC/DC power source can be improved. At the same time, an output current of the control IC can be suppressed, and reduction in a chip size of the control IC can be realized.

In the another output control device of the present invention, it is preferable that: the switching transistor chip controls an output current of an LED backlight circuit or a circuit having an LED as a load.

According to the arrangement, a lead from the control IC chip to a gate of a driven lateral power MOSFET is eliminated and wiring is shortened. This makes it possible to reduce L, C, and R components of the wiring. Accordingly, it becomes possible to reduce a switching loss due to the L, C, and R components, and efficiency of the LED backlight circuit or a circuit having an LED as a load can be improved. At the same time, an output current of the control IC can be suppressed, and reduction in a chip size of the control IC can be realized.

In the another output control device of the present invention, it is preferable that: the switching transistor chip controls an output voltage of a switching DC/DC converter.

According to the arrangement, a lead from the control IC chip to a gate of a driven lateral power MOSFET is eliminated and wiring is shortened. This makes it possible to reduce L, C, and R components of the wiring. Accordingly, it becomes possible to reduce a switching loss due to the L, C, and R components, and efficiency of the switching DC/DC converter can be improved. At the same time, an output current of the control IC can be suppressed, and reduction in a chip size of the control IC can be realized.

A still another output control device of the present invention includes: a switching transistor chip formed to control an output voltage or output current by having an on/off time ratio controlled; a control IC chip formed to control the on/off time ratio of the switching transistor chip on the basis of the output voltage or output current controlled by the switching transistor chip; a transistor island mounting the switching transistor chip; a chip island mounting the control IC chip; and a package containing the switching transistor chip and the control IC chip, the switching transistor chip being composed of a vertical power MOSFET.

According to the feature, it becomes possible to significantly reduce transfer of heat generated by the switching transistor chip to the control IC chip, as well as to electrically insulate the switching transistor chip from the control IC chip. It also becomes possible to change a material of an island mounting a vertical power MOSFET constituting the switching transistor chip to a material having a low heat resistivity.

In the still another output control device of the present invention, it is preferable that: a distance between the transistor island and the chip island is equal to or more than 0.5 mm.

According to the arrangement, it becomes possible to significantly reduce transfer of heat generated by the switching transistor chip to the control IC chip.

In the still another output control device of the present invention, it is preferable that: a distance dc between the switching transistor chip and the control IC chip satisfies: $dc \geq e0 \cdot em \cdot Sc \cdot (V/Vnc) \cdot BW \cdot Rc$, where: e0 is a permittivity of vacuum; em is a specific inductive capacity of a molding resin of the control IC chip; Sc is a size of an area where the switching transistor chip and the control IC chip face each other; V is a voltage amplitude of the switching transistor chip; Rc is an impedance of a control circuit of the control IC chip; BW is a bandwidth of the control circuit of the control IC chip; and Vnc is a voltage amplitude of noise permissible in the control circuit of the control IC chip.

According to the arrangement, the switching transistor chip and the control IC chip are apart from each other at a distance that satisfies $dc \geq e0 \cdot em \cdot Sc \cdot (V/Vnc) \cdot BW \cdot Rc$. Accordingly, it is possible to reduce transfer of switching noise from the switching transistor chip to the control IC chip.

It is preferable that the still another output control device of the present invention further includes: a lead terminal connected to either one of the transistor island and the chip island.

According to the arrangement, it becomes possible to dissipate the heat from the switching transistor chip through a lead terminal connected to the island. Accordingly, it becomes possible to significantly reduce the transfer of heat to the control IC chip.

In the still another output control device of the present invention, it is preferable that: the control IC chip includes a digital circuit and an analog circuit that is provided on a side opposite to the switching transistor chip with respect to the digital circuit.

According to the arrangement, in a layout of the control IC chip, an analog circuit susceptible to noise can be set farther apart from a noise source (switching transistor chip) by arranging the digital circuit on a side that is closer to the switching transistor chip.

It is preferable that the still another output control device of the present invention further includes: a lead terminal for grounding the switching transistor chip; and a lead terminal for grounding the control IC chip.

According to the arrangement, a source current of the switching transistor chip can be completely separated from a grounding current of the control IC chip. Accordingly, it is possible to reduce noise sneaking from the switching transistor chip to the control IC chip via ground.

In the still another output control device of the present invention, it is preferable that: the switching transistor chip is thinner than the control IC chip.

According to the arrangement, Rth of the switching transistor chip can be reduced. In a case of a two-package arrangement, the control IC chip is not influenced by heat generated by the switching transistor chip. However, in case of a one-package arrangement, because the control IC chip is influenced by heat generated by the switching transistor chip, particularly heat dissipation becomes important.

In the still another output control device of the present invention, it is preferable that: the control IC chip is coated with a resin having a low heat conductivity.

According to the arrangement, it becomes possible to reduce an influence of heat generated by the switching transistor chip to the control IC chip.

In the still another output control device of the present invention, it is preferable that: the switching transistor controls an output voltage of an AC/DC power source.

According to the arrangement, a lead from the control IC chip to a gate of a driven lateral power MOSFET is eliminated and wiring is shortened. This makes it possible to reduce L, C, and R components of the wiring. Accordingly, it becomes possible to reduce a switching loss due to the L, C, and R components, and efficiency of the AC/DC power source can be improved. At the same time, an output current of the control IC can be suppressed, and reduction in a chip size of the control IC can be realized.

In the still another output control device of the present invention, it is preferable that: the switching transistor controls an output current of an LED backlight circuit or a circuit having an LED as a load.

According to the arrangement, a lead from the control IC chip to a gate of a driven lateral power MOSFET is eliminated and wiring is shortened. This makes it possible to reduce L, C, and R components of the wiring. Accordingly, it becomes possible to reduce a switching loss due to the L, C, and R components, and efficiency of the LED backlight circuit or a circuit having an LED as a load can be improved. At the same time, an output current of the control IC can be suppressed, and reduction in a chip size of the control IC can be realized.

In the still another output control device of the present invention, it is preferable that: the switching transistor controls an output voltage of a switching DC/DC converter.

According to the arrangement, a lead from the control IC chip to a gate of a driven lateral power MOSFET is eliminated and wiring is shortened. This makes it possible to reduce L, C, and R components of the wiring. Accordingly, it becomes possible to reduce a switching loss due to the L, C, and R components, and efficiency of the switching DC/DC converter can be improved. At the same time, an output current of the control IC can be suppressed, and reduction in a chip size of the control IC can be realized.

An AC/DC power source device of the present invention is characterized by using the output control device of the present invention.

A circuit device, having an LED as a load, of the present invention is characterized by using the output control device of the present invention.

An LED backlight circuit device of the present invention is characterized by using the output control device of the present invention.

A switching DC/DC converter device of the present invention is characterized by using an output control device of the present invention.

In the output control device of the present invention, as mentioned above, a switching transistor is composed of a lateral power MOSFET. Accordingly, it becomes possible to reduce a size of an output transistor provided in the control IC. Consequently, reduction in a chip size becomes possible, and a low cost can be realized.

In another output control device of the present invention, as mentioned above, the switching transistor and the control IC are composed of separate chips, respectively. Accordingly, compared with a one-chip arrangement, it becomes possible to reduce a processing cost. Moreover, because the switching transistor and the control IC are arranged in one package, reduction in size and a low cost can be realized, compared with a two-package arrangement.

In the present invention, a lateral power MOSFET is used as a switching transistor. A backside of the lateral power MOSFET is a source (GND). Accordingly, the control IC chip and the switching transistor chip whose backsides are GND can be mounted on the same island (that has the same potential as the backsides). This makes it possible to realize a low cost.

In addition, a slit is provided between the switching transistor chip and the control IC chip mounted on the same island. This makes it possible to realize reduction in transfer of heat generated by the switching transistor chip, compared with a case of a same island without a slit, even when one-shot molding with a frame is used.

Furthermore, by separating the island of the switching transistor chip and the island of the control IC chip, it becomes possible to significantly reduce transfer of heat generated by the switching transistor chip to the control IC chip. It also becomes possible to change only a material of an island mounting the switching transistor that generates a large amount of heat to a material having a low heat resistivity.

BRIEF DESCRIPTION OF THE DRAWINGS

FIG. 13 is a cross sectional view illustrating an arrangement of the vertical power MOSFET constituting the switching transistor chip provided in the output control device.

DESCRIPTION OF THE EMBODIMENTS

The following will explain one embodiment of the present invention with reference to FIGS. 1 through 17.

Embodiment 1

Figure 1:
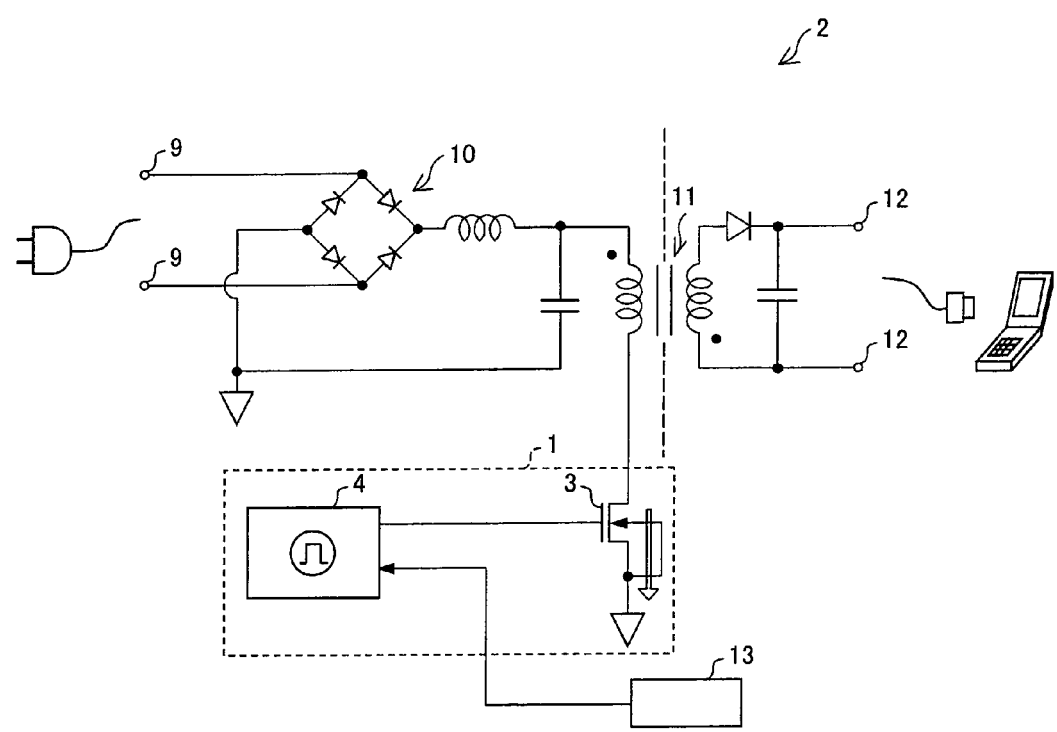
FIG. 1 is a circuit diagram illustrating a configuration of an AC/DC power source according to the Embodiment 1.
Figure 2:
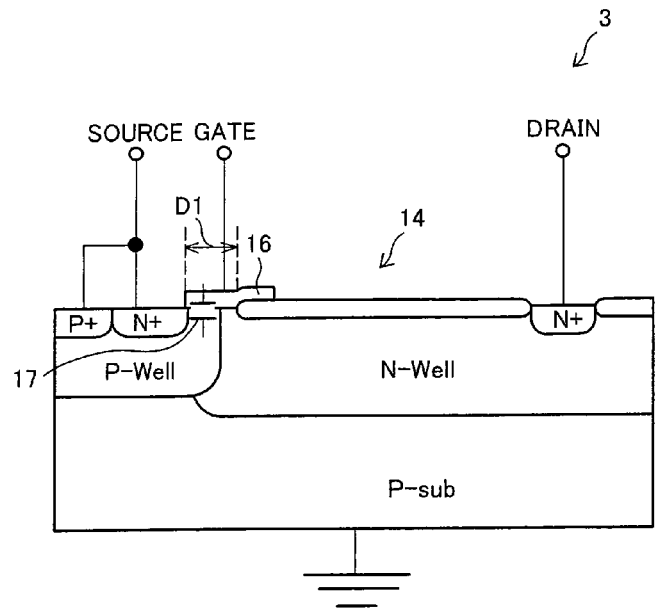
FIG. 2(a) is a cross sectional view illustrating an arrangement of a lateral power MOSFET provided in an output control device of the AC/DC power source.
FIG. 2(b) is a cross sectional view illustrating an arrangement of a vertical power MOSFET.
Figure 2:
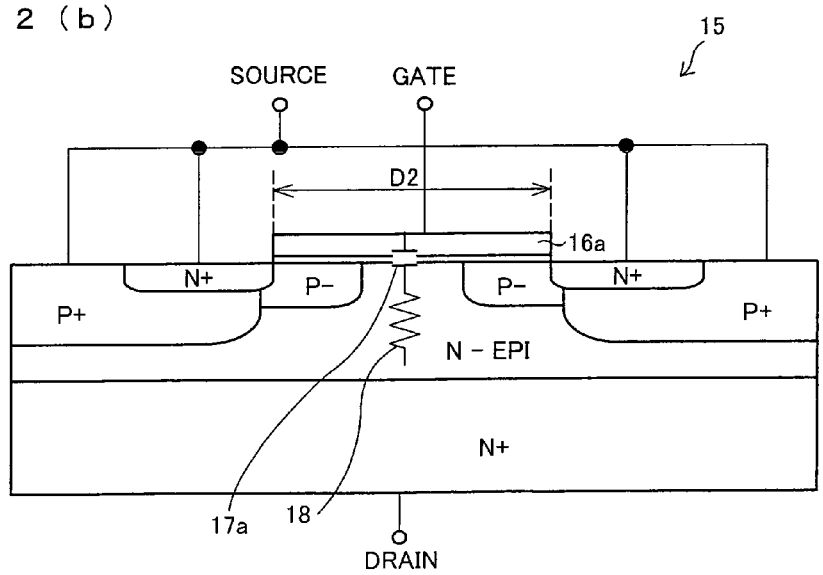
Figure 3:
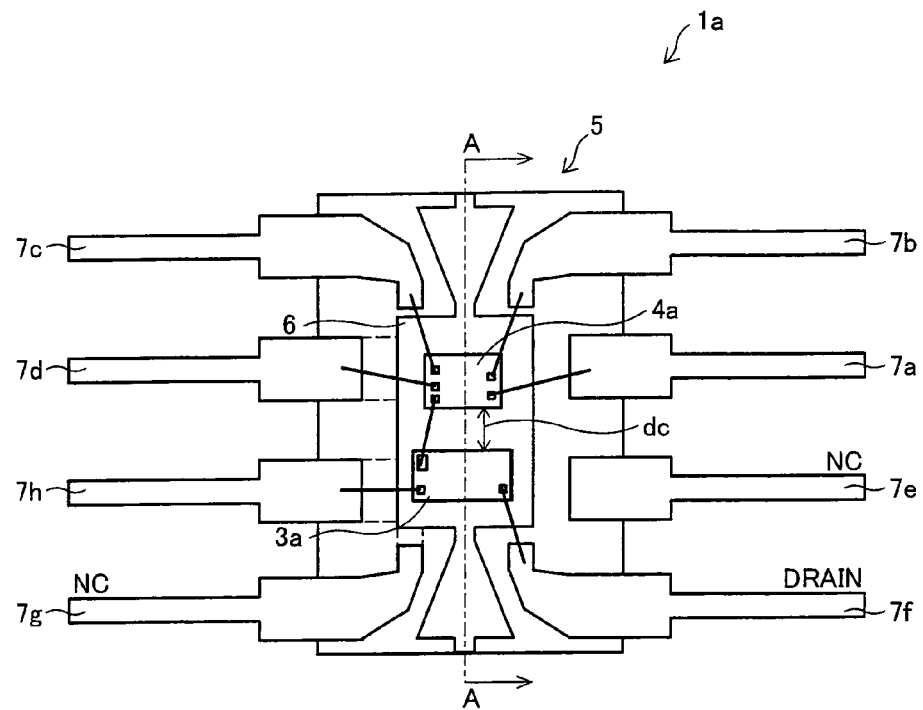
FIG. 3(a) is a plan view illustrating an arrangement of an output control device according to the Embodiment 2.
FIG. 3(b) is a cross sectional view taken along A-A of a surface as illustrated in FIG. 3(a).
Figure 3:
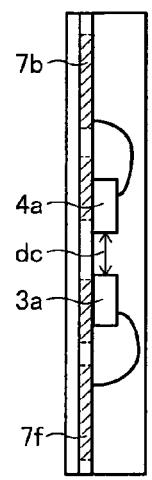
Figure 4:
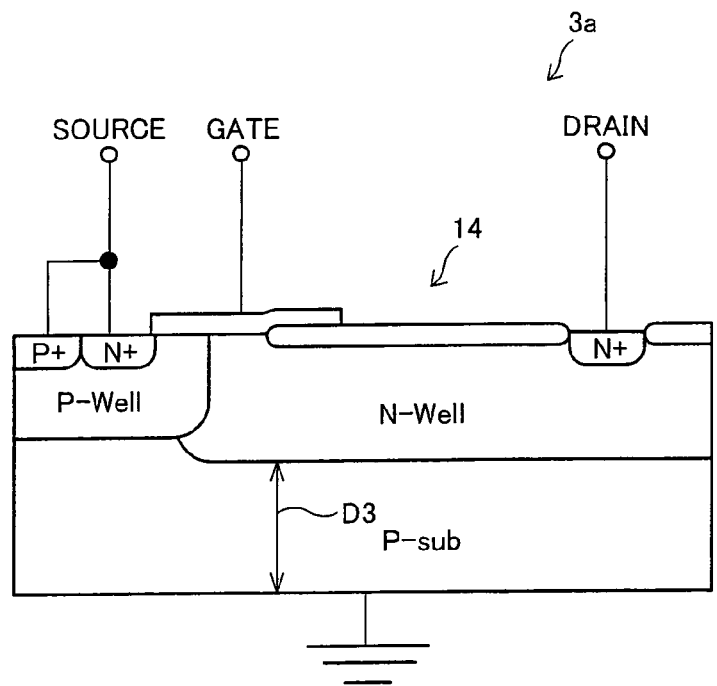
FIG. 4(a) is a cross sectional view illustrating an arrangement of a lateral power MOSFET constituting a switching transistor chip provided in the output control device.
FIG. 4(b) is a cross sectional view illustrating an arrangement of a vertical power MOSFET.
Figure 4:
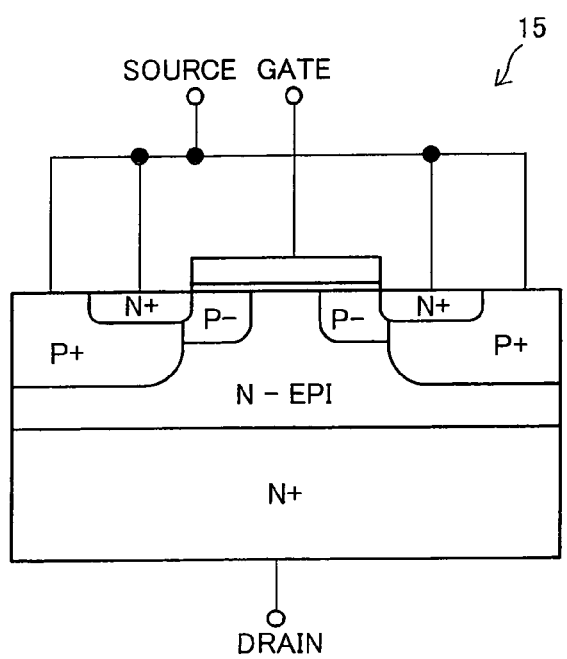

FIG. 1 is a circuit diagram illustrating a configuration of an AC/DC power source 2 according to the Embodiment 1. The AC/DC power source 2 is used for an AC adaptor or the like that charges an electronics apparatus of DC5V or the like with an AC power source. A system of the AC/DC power source 2 is characterized in that an output voltage is kept constant with the use of a control IC 4. The AC/DC power source 2 is divided into a primary side (high voltage) and a secondary side (low voltage) that have a transformer 11 on their boundary.

The AC/DC power source 2 includes a diode bridge 10. The diode bridge 10 rectifies 100V to 240V alternating voltage inputted into an AC power supply input terminal 9, and supplies the rectified voltage to the transformer 11 as an output voltage (DC 140V-DC 340V) of a primary-side circuit. The transformer 11 converts the output of the primary-side circuit to an output voltage (5V, 12V, or the like) of a secondary-side circuit. The output voltage is outputted from a DC output terminal 12.

The AC/DC power source 2 includes an output control device 1. The output control device 1 includes a switching transistor 3 that controls an output voltage by having an on/off time ratio controlled. The AC/DC power source 2 is provided with a feedback circuit 13 that generates a feedback signal in accordance with an output voltage controlled by the output control device 1. The output control device 1 includes the control IC 4 that controls the on/off time ratio of the switching transistor 3 in accordance with the feedback signal from the feedback circuit 13. The Embodiments 1 through 6 relate to the control IC 4 and the switching transistor 3, as illustrated in FIG. 1, in one package.

FIG. 2(a) is a cross sectional view illustrating an arrangement of a lateral power MOSFET 14 provided in the output control device 1 of the AC/DC power source 2. FIG. 2(b) is a cross sectional view illustrating an arrangement of a vertical power MOSFET 15. The switching transistor 3 is made of the lateral power MOSFET 14.

Here, a lateral power MOSFET is defined as a power MOSFET in which a current flows substantially in parallel with a surface of a chip. A vertical power MOSFET is defined as a power MOSFET in which a current flows in a direction of chip thickness and a drain current is generally drawn from a backside of the chip.

Because the lateral power MOSFET 14 has no parasitic J-FET 18 that parasitically exists in the vertical power MOSFET 15, a gate electrode 16 can be shorter than a gate electrode 16a. This makes it possible to reduce a gate capacitance 17 more than a gate capacitance 17a. As a result, a current driving the power MOSFET can be reduced. This allows an output current of the control IC 4 to be reduced. Consequently, because it becomes possible to reduce a size of an output transistor of the control IC 4, reduction of a chip size becomes possible. In other words, it becomes possible to reduce a cost of the control IC 4.

When the lateral power MOSFET 14 is employed as a switching transistor, the gate capacitance 17 can be reduced. This allows switching to be carried out at a high speed and a size of a transformer of a power source module to be reduced.

In the AC/DC power source 2 thus arranged, when AC 100V to AC 240V is inputted into the AC power supply input terminal 9, the diode bridge 10 rectifies the alternating current. The switching transistor 3 turns on/off the current that flows in the transformer 11, and a high voltage is converted into a low voltage via the transformer 11. Next, the feedback circuit 13 monitors the DC output voltage that is outputted from the DC output terminal 12 and transmits, to the control IC 4, a feedback signal indicative of information from the monitoring.

The control IC 4 receives the feedback signal corresponding to the output voltage. When the output voltage is higher than a desired voltage, the control IC 4 increases a ratio of off time of the switching transistor 3 so as to reduce a current flowing into the transformer 11. On the other hand, when the output voltage is lower than the desired voltage, the switching transistor 3 increases a ratio of on time so as to increase a current flowing into the transformer 11. In this way, the control IC 4 keeps the output voltage constant.

Embodiment 2

FIG. 3(a) is a plan view illustrating an arrangement of an output control device 1a according to the Embodiment 2. FIG. 3(b) is a cross sectional view taken along A-A of a surface as illustrated in FIG. 3(a). FIG. 4(a) is a cross sectional view illustrating an arrangement of a lateral power MOSFET 14 constituting a switching transistor chip 3a provided in the output control device 1a. FIG. 4(b) is a cross sectional view illustrating an arrangement of a vertical power MOSFET 15.

The output control device 1a includes a package 5. The package 5 is provided with a rectangular plate island 6. On the island 6, a switching transistor chip 3a and a control IC chip 4a are provided. There is a space of a distance dc between the switching transistor 3a and the control IC chip 4a. The switching transistor chip 3a is made of the lateral power MOSFET 14.

In a conventional switching transistor chip for which the vertical power MOSFET 15 as illustrated in FIG. 4(b) is used, a voltage of a backside varies from 0V to 700V because the backside is a drain electrode. Accordingly, it is not easy to mount the switching transistor chip on the same island as a control IC chip (whose backside is GND).

In the switching transistor chip 3a for which the lateral power MOSFET 14 as illustrated in FIG. 4(a) is used, a backside can be arranged as GND because the backside has the same potential as that of a source. Therefore, the switching transistor chip 3a can be mounted on the same island as the control IC chip 4a.

In this way, a backside of a lateral power MOSFET chip is a source (GND). Therefore, the backside of the lateral power MOSFET chip has the same potential as that of a backside of a control IC chip. Accordingly, the lateral power MOSFET can be mounted on the same island as the control IC without an insulating sheet or any specific processing on the island. This results in a low cost. Moreover, the best process can be used for fabrication of each of the control IC chip which preferably is produced in a process as fine as possible and the power MOSFET that has a large design rule. Therefore, a processing cost can be reduced, compared with a case where both of the control IC and the power MOSFET are realized in one chip.

Moreover, compared with a case where the control IC and the power MOSFET are realized by two packages, it is possible to reduce a packaging cost and to achieve reduction in size.

Because the switching transistor chip 3a and the control IC chip 4a are arranged in one package, it is possible to detect a temperature of the switching transistor chip 3a by the control IC chip 4a. Moreover, because the island has a uniform potential, it is possible to deal with a frame exposing a backside. This results in excellent heat dissipation.

The package 5 is provided with lead terminals 7a, 7b, 7c, and 7d that are connected to the control IC chip 4a by wire bonding. The lead terminal 7d is a grounding lead terminal of the control IC chip 4a. The package 5 is further provided with lead terminals 7e, 7f, 7g, and 7h that are connected to the switching transistor chip 3a by wire bonding. The lead terminal 7h is a grounding lead terminal of the switching transistor chip 3a.

The lead terminals 7d, 7h, and 7g are connected to an island 6. This allows the arrangement to have excellent heat dissipation. This is because a thermal conductivity of metal forming the island 6 is superior to that of a molding resin. Accordingly, by connecting lead terminals (source pin, GND pin) to the island, it is possible to dissipate, to GND of a substrate, heat transmitted to the island 6 from the switching transistor chip 3a via the lead terminals (source pin, GND pin). The heat dissipation of the arrangement can be further improved by employing a dummy (NC) pin for heat dissipation.

A two-chip arrangement including the control IC chip and the switching transistor chip allows development time to be shortened. This is because the control IC chip and the switching transistor chip are developed individually. In a case where a change in specification is required, only the chip whose specification is required to be changed needs to be dealt with in development. However, a chip to be unchanged does not need to be dealt with.

Moreover, the arrangement provides an effect of reduction in a development cost by shortening the development time. Other than this, the arrangement also provides an effect of reduction in the development cost as follows. In a case of a one-chip arrangement, 17 masks needs to be changed even in a case where either one of the control IC chip and the switching transistor chip requires a change in specification. On the other hand, in a case of the two-chip arrangement, only masks for the chip to be changed need to be changed. For example, 13 masks need to be changed for changing the control IC chip, or 9 masks for changing the switching transistor chip. Accordingly, cost for changing masks can be reduced, for example, by approximately 37%. The processing cost decreases in accordance with the reduction in the cost for changing the masks.

Furthermore, a development time becomes shorter in development of a line corresponding to other type of load. In other words, in a case of the two-chip arrangement, mostly it is possible to deal with a change only by changing the switching transistor when a type of load is changed. Therefore, an adequate lineup corresponding to many types of loads becomes possible only by developing switching transistors, and the development time can be shortened.

Figure 5:
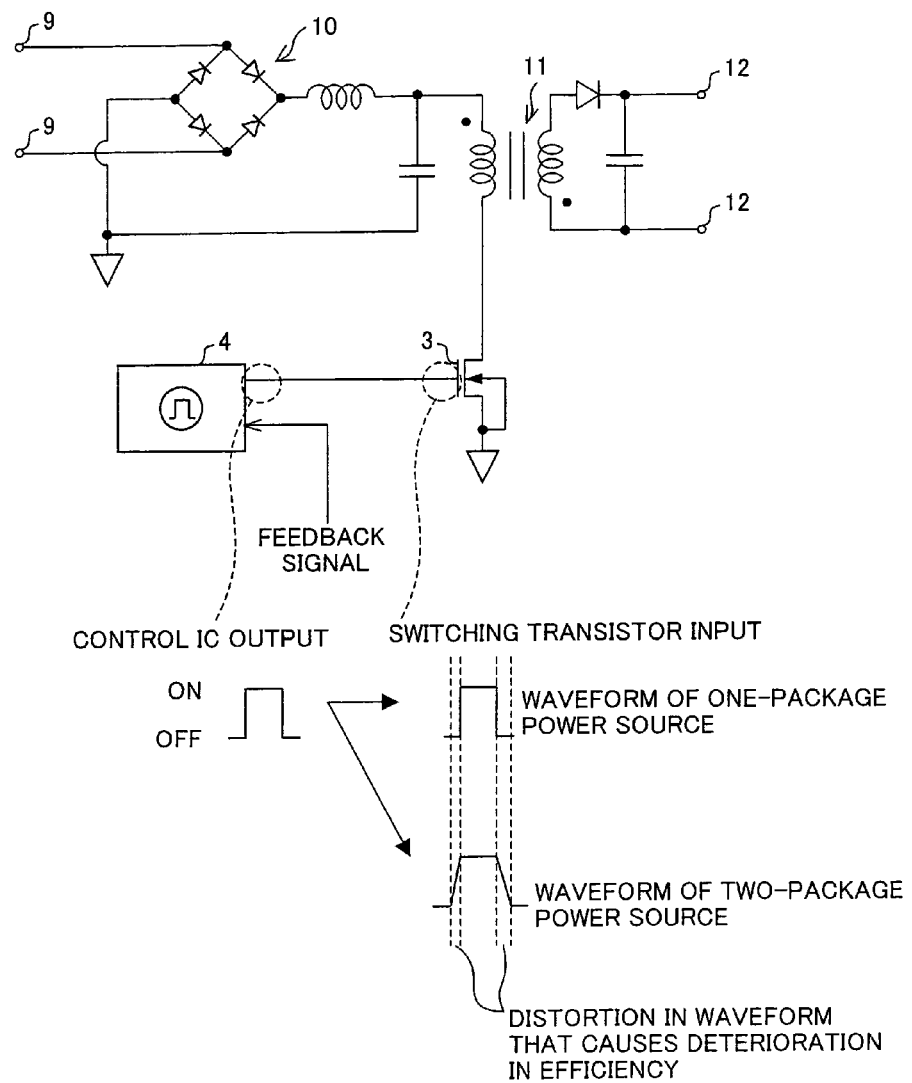
FIG. 5 is a diagram illustrating an effect of a one-package AC/DC power source.

FIG. 5 is a diagram illustrating an effect of a one-package AC/DC power source. In the AC/DC switching power source, in a case where the switching transistor 3 and the control IC 4 are arranged in one package, it is possible (i) to eliminate a lead from the control IC 4 to a gate of a power MOSFET (switching transistor 3) to be driven by the control IC, (ii) to shorten wiring, and (iii) to reduce L, C, and R components of the wiring. Accordingly, a switching loss due to the L, C, and R components can be reduced. This makes it possible to improve efficiency of the power source. Moreover, distortion, causing deterioration in the efficiency, in a waveform of the switching transistor can be removed by the one-package arrangement.

Figure 6:
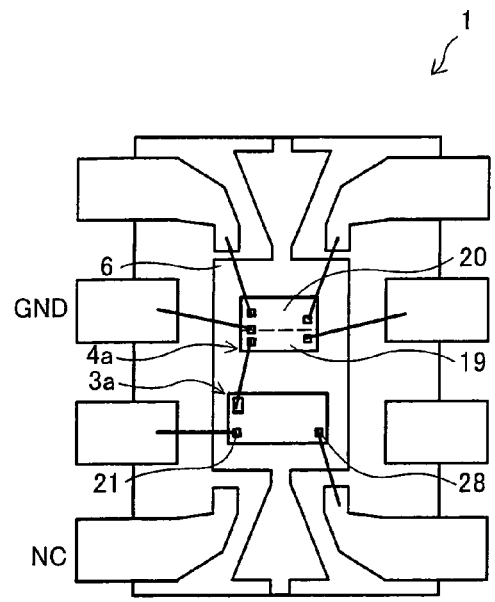
FIG. 6 is a plan view illustrating an arrangement of the switching transistor chip and the control IC chip provided in the output control device.

FIG. 6 is a plan view illustrating an arrangement of the switching transistor chip 3a and the control IC chip 4a provided in the output control device. In the control IC chip 4a, an analog circuit region 20 that is susceptible to noise is located in a position far from the switching transistor chip 3a that is a source of a switching noise. Meanwhile, a digital circuit region 19 resistant to noise is laid out in a position close to the switching transistor chip 3a. This allows the control IC chip 4a to become resistant to noise.

It is possible to reduce transmission of noise to the control IC chip 4a by providing, in a position far from the control IC chip 4a, a terminal 28 for drawing a drain current of the switching transistor chip 3a that is a source of noise.

Figure 7:
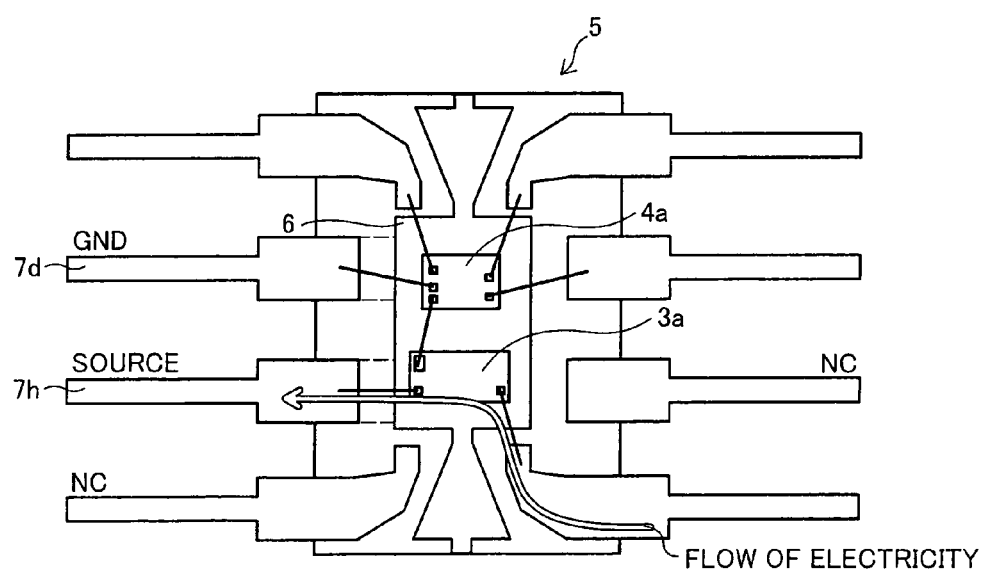
FIG. 7 is a plan view illustrating lead terminals provided in the output control device.

FIG. 7 is a plan view illustrating lead terminals provided in the output control device. The lead terminal 7h is provided as a GND pin of the switching transistor chip 3a and the lead terminal 7d is provided as a GND pin of the control IC chip 4a. This makes it possible to reduce a flow of a current, having flown out of a source of the switching transistor chip 3a, to the lead terminal 7d that is a GND pin on a side provided with the control IC chip 4a. Therefore, it becomes possible to reduce an influence of a current having flown out of the switching transistor chip 3a to a change in a GND potential of the control IC chip 4a.

Alternatively, the GND pins of the control IC chip 4a and the switching transistor chip 3a are connected in a different ways. Only a source pin of the switching transistor chip 3a is connected to the island 6. The lead terminal 7d that is a GND pin of the control IC chip 4a is not connected to the island 6. The lead terminal 7d that is a GND pin of the control IC chip 4a is provided apart from the island 6, and connected to the control IC chip 4a with wire.

This arrangement makes it possible to prevent a current having flown out of the source of the switching transistor chip 3a from flowing into GND of the control IC chip 4a. Consequently, it becomes possible to dissipate heat of the switching transistor chip 3a, as well as to reduce an influence of the current having flown out of the switching transistor chip 3a to a change in a GND potential of the control IC chip 4a.

In a switching transistor chip, a part generating heat is a surface of the switching transistor chip because a current flows from a drain to a source. The heat generated at this part is transmitted in a direction of chip thickness and dissipated from a backside of the chip. Here, a preferable heat dissipation characteristic can be obtained by reducing a thickness of the switching transistor chip 3a by reducing a thickness D3 of a P-substrate.

Figure 8:
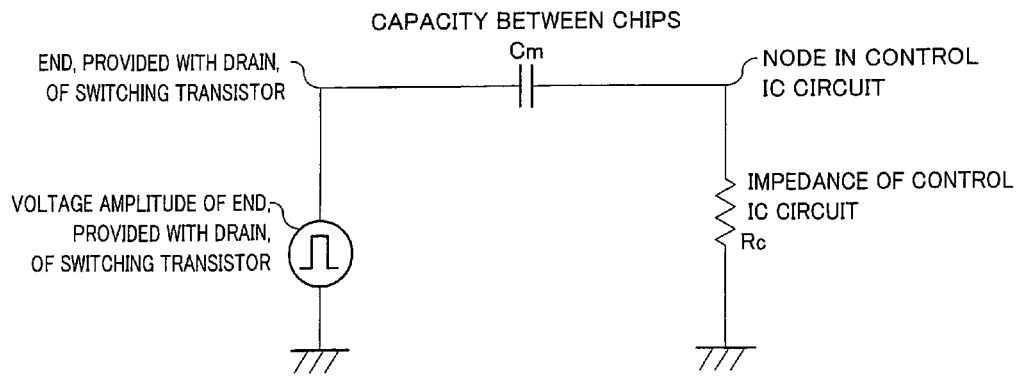
FIG. 8 is a diagram illustrating a distance between the switching transistor chip and the control IC chip provided in the output control device.
Figure 9:
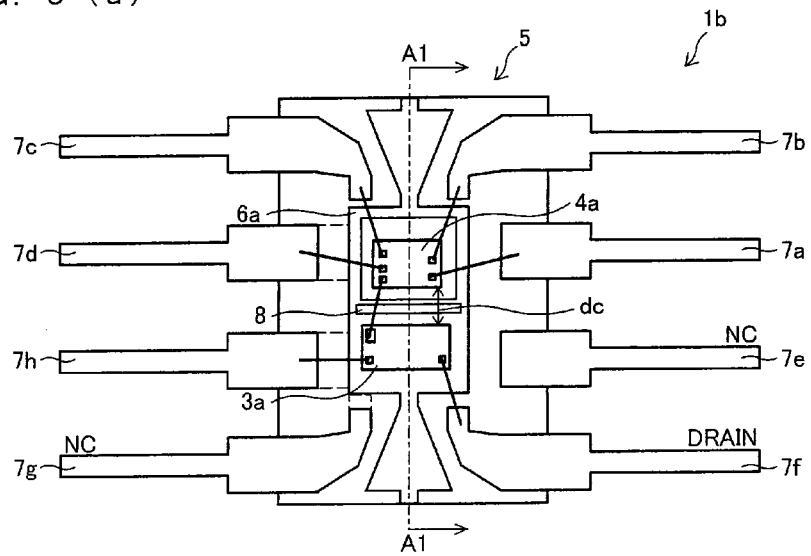
FIG. 9(a) is a plan view illustrating an arrangement of an output control device according to the Embodiment 3.
FIG. 9(b) is a cross sectional view taken along A1-A1 of a surface as illustrated in FIG. 9(a).
Figure 9:
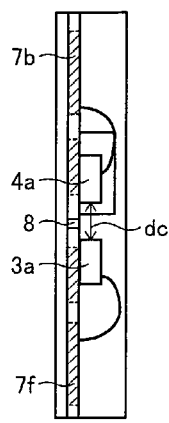
Figure 10:
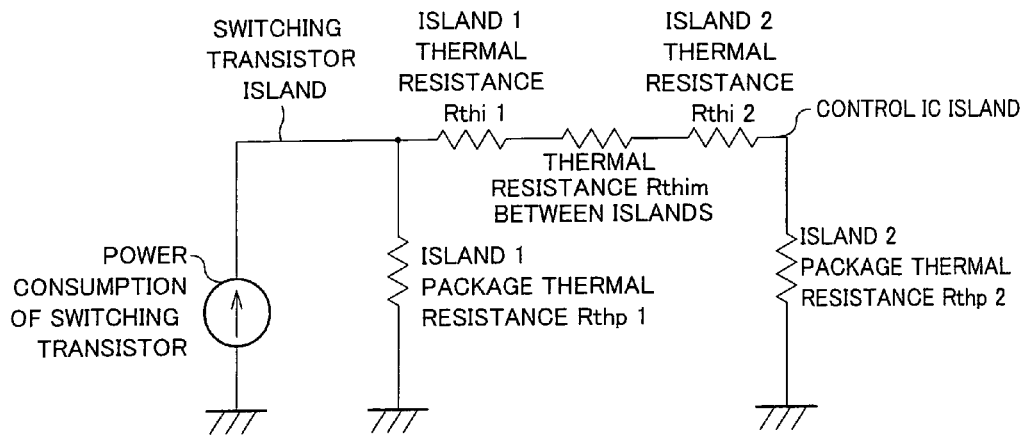
FIG. 10(a) is a diagram of a circuit model for explaining an effect of preventing heat transfer by a slit formed on an island provided in the output control device.
FIG. 10(b) is a diagram for physically explaining elements in the circuit model.
Figure 10:
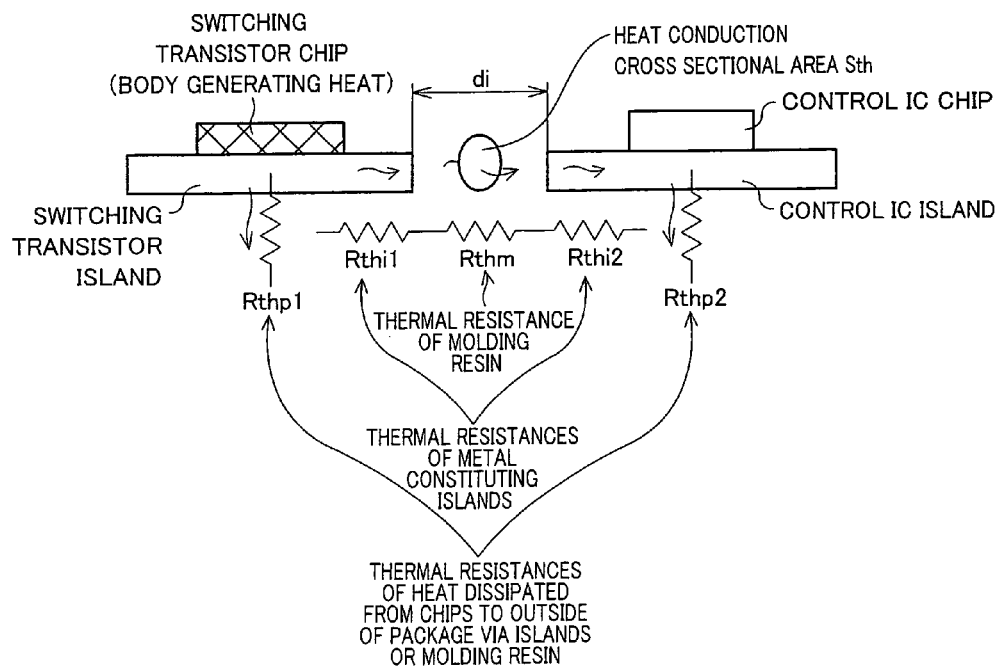
Figure 11:
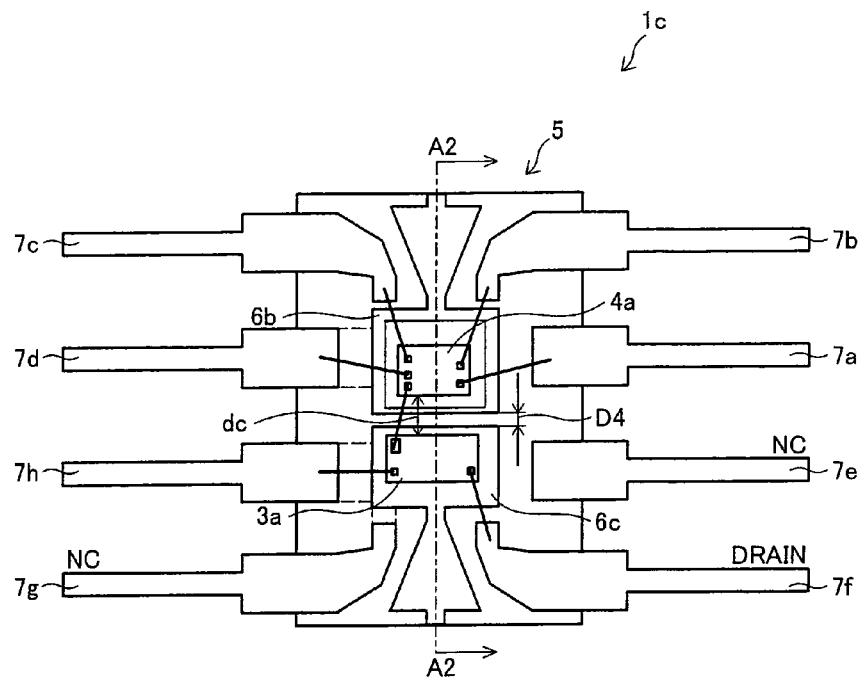
FIG. 11(a) is a plan view illustrating an arrangement of an output control device according to the Embodiment 4.
FIG. 11(b) is a cross sectional view taken along A2-A2 of a surface as illustrated in FIG. 11(a).
Figure 11:
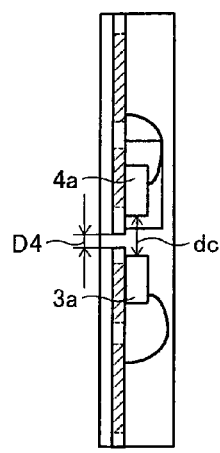
Figure 12:
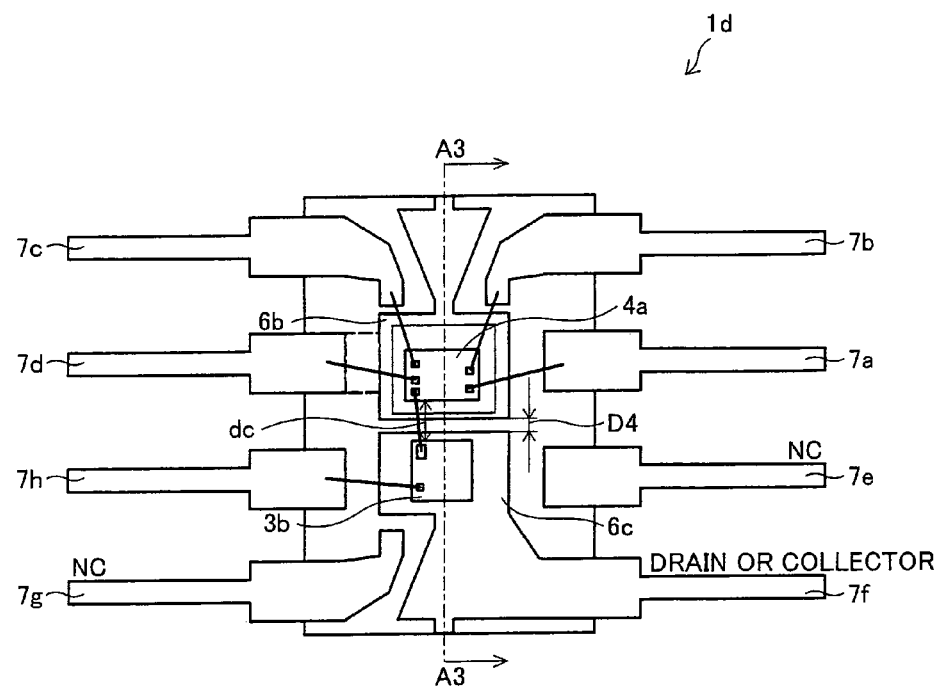
FIG. 12(a) is a plan view illustrating an arrangement of an output control device according to the Embodiment 5.
FIG. 12(b) is a cross sectional view taken along A3-A3 of a surface as illustrated in FIG. 12(a).
Figure 12:
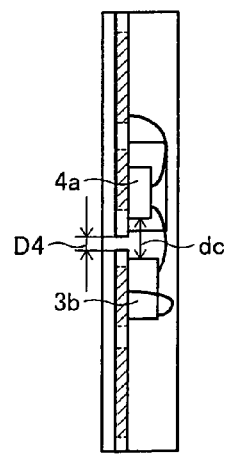

FIG. 8 is a diagram illustrating a distance between the switching transistor chip 3a and the control IC chip 4a provided in the output control device.

A voltage produced by rectifying an AC power supply is applied to an end, provided with a drain, of a switching transistor. Accordingly, a voltage amplitude equal to or more than 200V is generated by a switching operation. A capacitance Cm between the chips is expressed as:

$$Cm = e0 \cdot em \cdot (Sc/dc),$$

where: e0 is a permittivity of vacuum; em is a specific inductive capacity of a molding resin; Sc is a size of an area where two chips face each other; and dc is a distance between the chips.

In the switching transistor, a noise voltage Vnc generated at a node in a control circuit is expressed as:

$$Vnc = Cm(dV/dt) \cdot Rc$$
$$= Cm \cdot V \cdot BW \cdot Rc$$
$$= e0 \cdot em \cdot (Sc/dc) \cdot V \cdot BW \cdot Rc,$$

where: V is a voltage amplitude; Rc is an impedance of the control circuit; and BW is a bandwidth of the control circuit.

Accordingly, in order to suppress a noise voltage generated in the control circuit to equal to or less than the Vnc, the distance dc between the chips needs to be:

$$dc \geq e0 \cdot em \cdot Sc \cdot (V/Vnc) \cdot BW \cdot Rc$$

Now, for example, it is assumed that: Sc is 2 mm$^2$; em is 4.5; the voltage amplitude V of the switching transistor is 200V; the impedance Rc of the control circuit is 100 kΩ; the bandwidth BW of the control circuit is 10 kHz; and noise voltage Vnc in the control circuit is equal to or less than 10 mV based on, for example, an A/D converter accuracy. Then, a necessary distance between the chips is calculated to be equal to or more than 2 mm.

Here, Vnc is proportional to (Sc/dc). Meanwhile, Sc is determined by a chip thickness and a length of a side of a chip which side faces the other chip. In a case where the chip thickness is substantially constant and the length of the side of the chip which side faces the other chip is Wc, Vnc is proportional to (Wc/dc). Sc=2 mm² of this example is equivalent to that in a case where Wc=1.5 mm. Accordingly, in this case, (Wc/dc) becomes equal to 0.75. From this, dc necessary for Vnc≦10 mV is calculated by:

$$dc \geq 1.3 \times Wc$$

that is a proportion with respect to the length Wc of the side of the chip which side faces the other chip.

In this way, the distance dc between the switching transistor chip 3a and the control IC chip 4a satisfies the following equation:

$$dc \geq e0 \cdot em \cdot Sc \cdot (V/Vnc) \cdot BW \cdot Rc,$$

where:
e0 is a permittivity of vacuum;
em is a specific inductive capacity of a molding resin of the control IC chip 4a;
Sc is a size of an area where the switching transistor chip 3a and the control IC chip 4a face each other;
V is a voltage amplitude of the switching transistor chip 3a;
Rc is an impedance of a control circuit the control IC chip 4a;
BW is a bandwidth of the control circuit of the control IC chip 4a; and
Vnc is a voltage amplitude of noise permissible in the control circuit of the control IC chip 4a.

Because a backside of a chip becomes a drain electrode according to the vertical power MOSFET 15, the vertical power MOSFET 15 requires die bonding with expensive eutectic soldering whose resistance is low. On the other hand, in the lateral power MOSFET 14, a current flows on a surface of the chip and there is no electrode on a backside of the chip. Therefore, die bonding of the lateral power MOSFET 14 can be realized with a low-cost Ag paste.

Embodiment 3

FIG. 9(a) is a plan view illustrating an arrangement of an output control device 1b according to the Embodiment 3. FIG. 9(b) is a cross sectional view taken along A1-A1 of a surface as illustrated in FIG. 9(a). Members given the same reference numerals as the members as explained above respectively have identical functions and the detailed explanations thereof are omitted.

The output control device 1b of the Embodiment 3 is different from an output control device 1a of the Embodiment 2 in that a slit 8 is formed on the island 6a.

By arranging a width of the slit 8 to be equal to or more than 0.5 mm, heat transfer from one side of the island to the other can be prevented. Consequently, a rise in a temperature of the control IC chip 4a can be prevented.

FIG. 10(a) is a diagram of a circuit model for explaining an effect of preventing heat transfer by the slit 8 formed on the island 6a provided in the output control device 1b. FIG. 10(b) is a diagram physically explaining elements in the circuit model. The model as illustrated in FIG. 10(a) illustrates a thermal circuit as an electrical circuit. As illustrated in FIG. 10(b), each of the elements in the circuit physically shows heat generated by a switching transistor or a thermal resistance of each part.

A circuit as illustrated in FIG. 10(a) is produced by replacing a power consumption of a switching transistor in FIG. 10(b) by a current source and a thermal resistance of each part in FIG. 10(b) by an electrical resistance. An island 1 package thermal resistance and an island 2 package thermal resistance are respectively thermal resistances at heat dissipation to the outside of the packages from the island 1 and the island 2. The island 1 and the island 2 package thermal resistances include heat dissipation effect via molding resin, a lead frame, or the like. An island 1 thermal resistance and an island 2 thermal resistance are thermal resistances of metal constituting the islands, respectively. A thermal resistance between islands is a thermal resistance of a molding resin provided in a slit between the islands.

Rthm is expressed as the following equation:

$$Rthm = di/(Sth \cdot Gthm),$$

where a thermal conductivity Gthm of molding resin, a heat conduction cross sectional area Sth, and a distance di between islands are used.

Now, provided that: di is 0.5 mm; Sth is 3 mm²; and Gthm is 0.6 W/m·K, it is calculated that Rthm is 278° C./W.

Moreover, provided that: the power consumption of the switching transistor is 1 W; each of the island 1 package thermal resistance Rthp 1 and the island 2 package thermal resistance Rthp 2 is 100° C./W; and each of the island 1 thermal resistance Rthi 1 and the island 2 thermal resistance Rthi 2 is 150° C./W, it is calculated that a rise in a temperature of a control IC island is 11° C.

However, in a case where Rthm is 0° C./W, in other words, both of the switching transistor and the control IC are die-bonded to a common island, it is calculated that a rise in the temperature of the control IC island is 20° C.

A thermal conductivity of a general molding resin is equal to or less than 1/20 of that of 42 alloys each being used as a material of a lead frame. Accordingly, an equal to or more than 0.5 mm space between the islands can provide an effect of preventing thermal transfer from the switching transistor to the control IC.

For the purpose of obtaining an effect of preventing thermal transfer further, after a control IC chip 4a is coated with a resin having a low thermal conductivity, both chips are molded with a resin.

An effect of the slit 8 reduces heat directly transferred from the island having a high thermal conductivity and increases heat transferred through the resin. Accordingly, by coating the control IC chip 4a by the resin having a low thermal conductivity, it is possible to reduce heat transfer to the control IC chip 4a.

According to the Embodiment 3, a slit is formed on the island. Accordingly, it is possible to reduce transfer of heat generated by the switching transistor chip to the control IC chip. One-shot molding with a frame also becomes possible.

Because a lower limit value of a distance dc that is necessary between chips is determined, the same effect as in the Embodiment 2 is obtained.

Moreover, because lead terminals are connected to the island, the same effect as in the Embodiment 2 is obtained. Furthermore, a circuit layout on the control IC chip and a position of a terminal drawing a drain current of the switching transistor chip are arranged so as to make it possible to obtain the same effect as in the Embodiment 2. Because the control IC chip and the switching transistor chip have different pins for grounding, respectively, the same effect as in the Embodiment 2 is obtained. Because the switching transistor chip is thinned down, the same effect as in the Embodiment 2 is obtained. In addition, because an Ag paste is used, the same effect as in the Embodiment 2 is obtained.

Embodiment 4

FIG. 11(a) is a plan view illustrating an arrangement of an output control device 1c according to the Embodiment 4. FIG. 11(b) is a cross sectional view taken along A2-A2 of a surface as illustrated in FIG. 11(a). Members given the same reference numerals as the members as explained above respectively have identical functions and the detailed explanations thereof are omitted.

The output control device 1c of the Embodiment 4 is different from an output control device 1a of the embodiment 2 in that an island is separated so as to provide the output control device 1c with a transistor island 6c that mounts a switching transistor chip 3a and a chip island 6b that mounts a control IC chip 4a.

Because a lateral power MOSFET chip and a control IC chip are mounted on the separate islands, respectively, heat generated by the switching transistor chip 3a is prevented from being transferred to the control IC chip 4a directly via an island. Accordingly, it is possible to reduce influence of heat more, compared with a case where the switching transistor chip 3a and the control IC chip 4a are mounted on the same island. Consequently, an insulating sheet does not need to be provided to a backside of the control IC chip 4a, and a low cost can be realized. In addition, because the islands are separate, an arrangement that realizes high heat dissipation at a low cost becomes possible by changing only a material of the transistor island 6c of a switching transistor that generates a large amount of heat to a material having a low thermal resistivity.

When a distance D4 between the transistor island 6c and the chip island 6b is arranged to be equal to or more than 0.5 mm, heat conduction between the islands can be prevented. Therefore, a rise in a temperature of the control IC chip 4a can be prevented.

According to the embodiment 4, because a lower limit of a necessary distance dc between the chips is set, the same effect as in the Embodiment 2 can be obtained. Moreover, because lead terminals are connected to the island, the same effect as in the Embodiment 2 is obtained. Furthermore, a circuit layout on the control IC chip and a position of a terminal drawing a drain current of the switching transistor chip are arranged so as to make it possible to obtain the same effect as in the Embodiment 2. Because the control IC chip and the switching transistor chip have different pins for grounding, respectively, the same effect as in the Embodiment 2 is obtained. Because the switching transistor chip is thinned down, the same effect as in the Embodiment 2 is obtained. Because an Ag paste is used, the same effect as in the Embodiment 2 is obtained. In addition, the control IC chip is coated with a resin, the same effect as in the Embodiment 2 is obtained.

Embodiment 5

FIG. 12(a) is a plan view illustrating an arrangement of an output control device 1d according to the Embodiment 5. FIG. 12(b) is a cross sectional view taken along A3-A3 of a surface as illustrated in FIG. 12(a). FIG. 13 is a cross sectional view illustrating an arrangement of the vertical power MOSFET constituting a switching transistor chip 3b provided in the output control device 1d. Members given the same reference numerals as the members as explained above respectively have identical functions and the detailed explanations thereof are omitted.

The output control device 1d of the Embodiment 5 is different from the output control device 1c of the Embodiment 4 in that a switching transistor chip 3b is arranged by a vertical power MOSFET.

In a case where, with the use of a vertical power MOSFET (FIG. 4(b)), a switching transistor chip 3b and a control IC chip 4a are mounted on separate islands, respectively, and sealed in one package, a specific value is determined for a distance between the islands so as to reduce influence of noise or heat generated by the switching transistor chip 3b. Moreover, a lead frame and a layout are arranged to reduce the influence of the noise or heat on the control IC. The following explains this arrangement more specifically.

When the vertical power MOSFET chip and the control IC chip are mounted on the separate islands, respectively, the two chips are electrically insulated. This can reduce transfer of switching noise or heat significantly. Moreover, because provision of an insulating sheet to a backside of the control IC chip becomes unnecessary, a low cost can be realized. In this way, a low cost and thermal insulation of the control IC chip can be realized at the same time. Furthermore, because the islands are separate, it is possible to change only a material of an island of a switching transistor that generates a large amount of heat to a material having a low thermal resistivity. This makes it possible to realize high heat dissipation at a low cost.

When a distance D4 between the islands is arranged to be equal to or more than 0.5 mm, heat transfer between the islands can be prevented. Therefore, a rise in a temperature of the control IC chip 4a can be prevented.

A distance dc between chips is a distance expressed by:

$$dc \geq e0 \cdot em \cdot Sc \cdot (V/Vnc) \cdot BW \cdot Rc.$$

Note that: e0 is a permittivity of vacuum; em is a specific inductive capacity of a molding resin; Sc is a size of an area where two chips face each other; V is a voltage amplitude of the switching transistor; Rc is a control circuit impedance; BW is a bandwidth of the control circuit; and Vnc is a voltage amplitude of noise permissible in the control circuit.

This arrangement makes it possible to reduce coupling noise defined by I=C(dV/dt).

By connecting a lead terminal to the island, it is possible to obtain an arrangement excellent in heat dissipation because thermal conductivity of metal constituting the island is superior to that of a molding resin.

In the IC chip 4a, an analog circuit region that is susceptible to noise is provided in a position farther from the switching transistor chip 3b that is a cause of switching noise, and a digital circuit region resistant to noise is laid out in a position that is closer to the switching transistor chip 3b. This arrangement makes the control IC chip 4a become resistant to noise.

When GND pins of the control ID chip 4a and the switching transistor 3b are different (lead terminals 7h and 7d), a current having flown out of a source of the switching transistor 3b can be prevented from flowing into the GND pin of the control IC chip. Therefore, it is possible to reduce influence of a change in a GND potential of the control IC chip 4a due to a current having flown out of the switching transistor chip 3b.

When a thickness of the switching transistor chip 3b is reduced, heat generated by the switching transistor chip 3b is dissipated to the transistor island 6c mainly from the backside of the switching transistor chip 3b. A heat resistance decreases by thinning down the chip. This makes it possible to obtain an arrangement excellent in heat dissipation. Because a withstand voltage of the device depends on an N-epitaxial layer, the reduced chip thickness does not affect the withstand voltage of the device.

After coating the control IC chip 4a with a resin having a low thermal conductivity, the both chips are molded with a resin. In such a case, because the islands are separate, the heat generated by the switching transistor chip 3b is transferred to the control chip IC 4a via the resin. It is possible to reduce the transfer of heat to the control IC chip 4a by coating the control IC chip 4a with the resin having a low conductivity.

Embodiment 6

Each output control device according to the embodiments explained above as examples is provided in an AC/DC power source. However, the present invention is not limited to this. The output control device of the present invention may be provided in an LED backlight circuit, an LED illumination circuit having a light control function, or a switching DC/DC converter.

Figure 14:
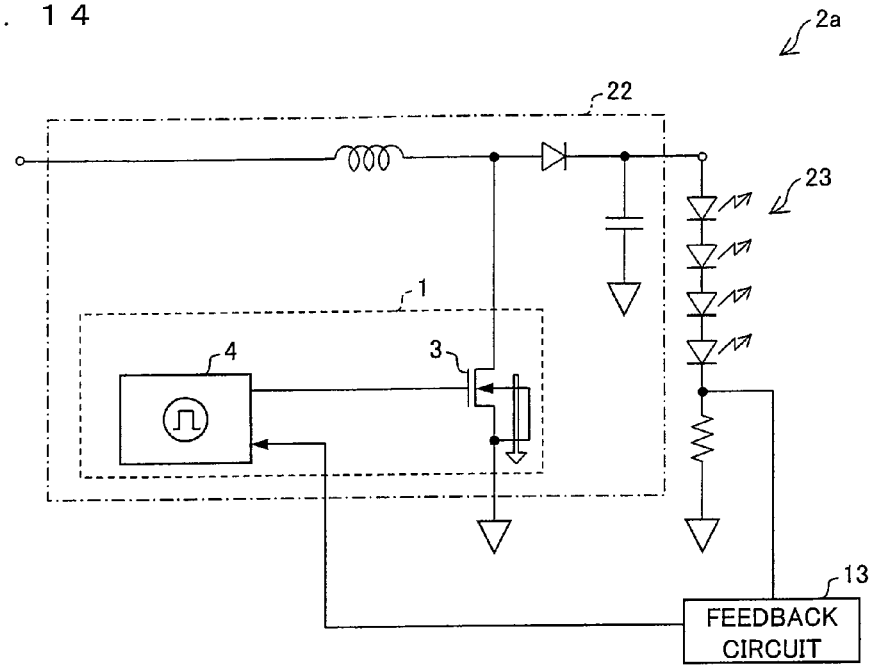
FIG. 14 is a circuit diagram illustrating a configuration of an LED backlight circuit according to the Embodiment 6.

FIG. 14 is a circuit diagram illustrating a configuration of an LED backlight circuit 2a according to the Embodiment 6. The LED backlight circuit 2a includes a voltage boosting circuit 22. The voltage boosting circuit 22 boosts a predetermined DC input (for example, 25V) to a high DC voltage (for example, 60V) and outputs the high DC voltage. The boosted DC voltage is supplied to an LED. In the boosting circuit 22, an output control device 1 is provided. The output control device 1 includes a switching transistor 3 that controls a DC voltage by having an on/off time ratio controlled.

The LED backlight circuit 2a includes a feedback circuit 13. The feedback circuit 13 detects a current flowing into an LED and supplies a feedback signal to a control IC 4. The control IC 4, on the basis of the feedback signal, monitors the current flowing in the LED and controls on/off time of the switching transistor 3 so that an appropriate current can be outputted. In a case of an LED load, a current of a DC output is controlled to be a desired value by using the control IC 4. Output control devices of the Embodiments 1 through 5 as explained above can be applied to this application circuit.

Figure 15:
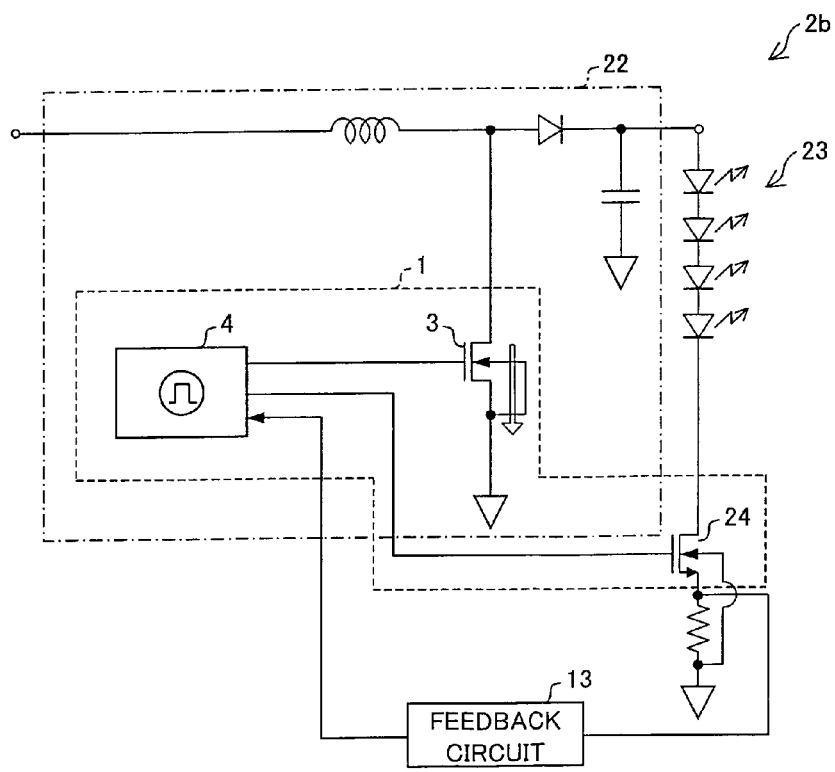
FIG. 15 is a circuit diagram illustrating a configuration of an LED illumination circuit with a light control function according to the Embodiment 6.

FIG. 15 is a circuit diagram illustrating a configuration of an LED illumination circuit 2b with a light control function according to the Embodiment 6. Members given the same reference numerals as the members as explained above respectively have identical functions and the detailed explanations thereof are omitted.

The LED illumination circuit 2b with a light control function, as illustrated in FIG. 15, is a circuit arranged by adding a light control switching transistor 24 between an LED 23 and GND of FIG. 14. A backside of the light control switching transistor 24 is also GND and can be arranged to have the same potential as that of the backside of the control IC 4. Accordingly, the output control devices as explained in the Embodiments 1 through 5 can be applied to this application circuit.

Figure 16:
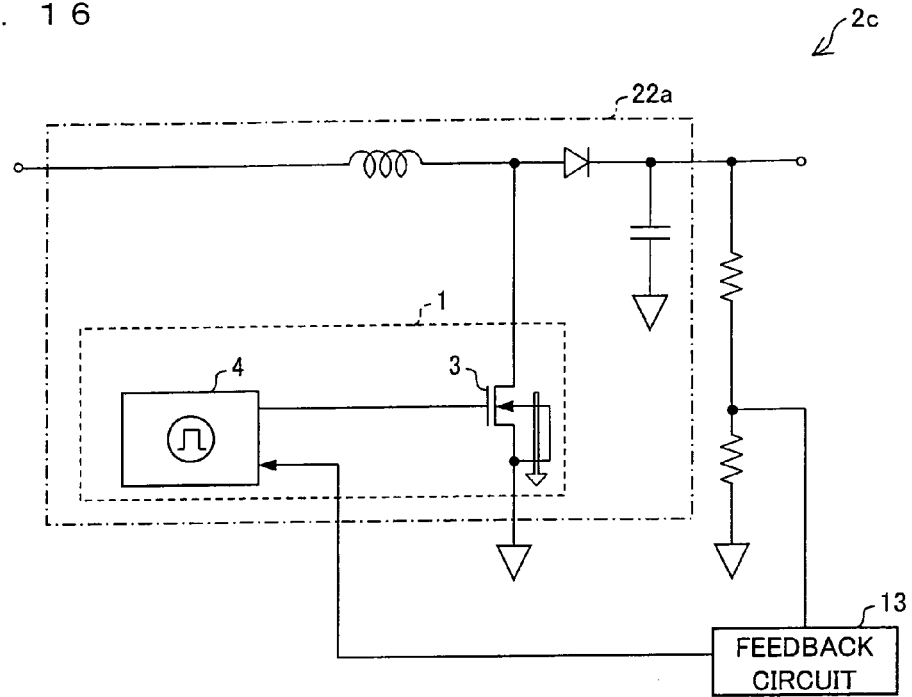
FIG. 16 is a circuit diagram illustrating a configuration of a switching DC/DC converter according to the Embodiment 6.

FIG. 16 is a circuit diagram illustrating a configuration of a switching DC/DC converter 2c according to the Embodiment 6. Members given the same reference numerals as the members as explained above respectively have identical functions and the detailed explanations thereof are omitted.

The switching DC/DC converter 2c includes a voltage boosting circuit 22a. The voltage boosting circuit 22a boosts a predetermined DC input (for example, 12V) to a high DC voltage (for example, 24V) and outputs the high DC voltage.

In the boosting circuit 22, an output control device 1 is provided. The output control device 1 includes a switching transistor 3 that controls a DC voltage by having an on/off time ratio controlled.

The switching DC/DC converter 2c includes a feedback circuit 13. The feedback circuit 13 detects an output voltage and supplies a feedback signal to the control IC 4. The control IC 4, on the basis of the feedback signal, monitors the output voltage and controls on/off time of the switching transistor 3 so that an appropriate voltage can be outputted. The output control circuits of the Embodiments 1 through 5 as explained above can be applied to this application circuit.

Figure 17:
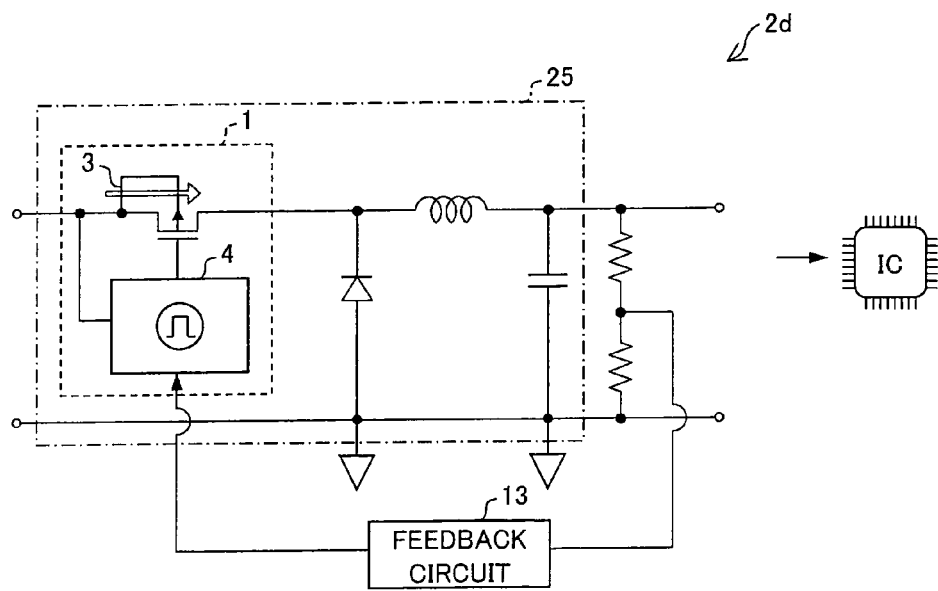
FIG. 17 is a circuit diagram illustrating a configuration of another switching DC/DC converter according to the Embodiment 6.

FIG. 17 is a circuit diagram illustrating a configuration of another switching DC/DC converter 2d according to the Embodiment 6. Members given the same reference numerals as the members as explained above respectively have identical functions and the detailed explanations thereof are omitted.

The switching DC/DC converter 2d includes a voltage lowering circuit 25. The voltage lowering circuit 25 lowers a predetermined DC input (for example 12V) to a low DC voltage (for example 3.3V) and outputs the low DC voltage. The switching DC/DC converter 2d keeps a DC output voltage constant by using the control IC 4 as in a case of an AC adaptor.

Here, all application circuits as illustrated in FIGS. 14 through 16 assume that the switching transistor is composed of a lateral N-channel power MOSFET and the control IC is made of a CMOS formed on a P-substrate. On the other hand, in the application circuit as illustrated in FIG. 17, the techniques in the embodiments of the present invention become applicable by arranging a circuit in which a lateral P-channel power MOSFET is used as the switching transistor 3 and a CMOS formed on an N-substrate is used as the control IC 4.

A P-channel power MOSFET can be realized by reversing P and N of all P and N electric conductors, as in FIG. 4(a). In both of the P-channel power MOSFET and the CMOS formed on an N-substrate, the backside of each chip has the highest potential in the circuit. In a case of the application circuit as illustrated in FIG. 17, by arranging a DC power supply input terminal to have potentials of the backsides of both chips, the backsides of the two chips can have the same potential. In this way, the two chips can be die-bonded to the same island. As a result, the technique of the Embodiments of the present invention becomes applicable.

The present invention is not limited to the description of the embodiments above, but may be altered by a skilled person within the scope of the claims. An embodiment based on a proper combination of technical means disclosed in different embodiments is encompassed in the technical scope of the present invention.

The present invention can be applied to an output control device including a switching transistor controlling an output voltage or an output current by having an on/off time ratio controlled and a control IC controlling the on/off time ratio of the switching transistor on the basis of the output voltage or the output current controlled by the switching transistor. Examples of the output control device are an AC/DC power source, an LED backlight circuit or a circuit having an LED as a load, and a switching DC/DC converter.

What is claimed is:

1. An output control device comprising:
  a switching transistor controlling an output voltage or output current by having an on/off time ratio controlled; and
  a control IC controlling the on/off time ratio of the switching transistor on the basis of the output voltage or output current controlled by the switching transistor, the switching transistor being composed of a lateral power MOSFET.

2. The output control device as set forth in claim 1 wherein:
the switching transistor controls an output voltage of an AC/DC power source.

3. The output control device as set forth in claim 1 wherein:
the switching transistor controls an output current of an LED backlight circuit or a circuit having an LED as a load.

4. The output control device as set forth in claim 1 wherein:
the switching transistor controls an output voltage of a switching DC/DC converter.

5. An output control device comprising:
a switching transistor chip formed to control an output voltage or output current by having an on/off time ratio controlled;
a control IC chip formed to control the on/off time ratio of the switching transistor chip on the basis of the output voltage or output current controlled by the switching transistor chip; and
a package containing the switching transistor chip and the control IC chip,
the switching transistor chip being composed of a lateral power MOSFET.

6. The output control device as set forth in claim 5, wherein:
the switching transistor chip and the control IC chip are mounted on a same island.

7. The output control device as set forth in claim 5, wherein:
a distance dc between the switching transistor chip and the control IC chip satisfies:

$$dc \geq e0 \cdot em \cdot Sc \cdot (V/Vnc) \cdot BW \cdot Rc,$$

where:
e0 is a permittivity of vacuum;
em is a specific inductive capacity of a molding resin of the control IC chip;
Sc is a size of an area where the switching transistor chip and the control IC chip face each other;
V is a voltage amplitude of the switching transistor chip;
Rc is an impedance of a control circuit of the control IC chip;
BW is a bandwidth of the control circuit of the control IC chip; and
Vnc is a voltage amplitude of noise permissible in the control circuit of the control IC chip.

8. The output control device as set forth in claim 5, further comprising:
an island mounting at least either one of the switching transistor chip and the control IC chip; and
a lead terminal connected to the island.

9. The output control device as set forth in claim 5, wherein:
the control IC chip includes a digital circuit and an analog circuit that is provided on a side opposite to the switching transistor chip with respect to the digital circuit.

10. The output control device as set forth in claim 5, wherein:
the switching transistor chip includes a terminal drawing a drain current, the terminal being provided on a side opposite to the control IC chip.

11. The output control device as set forth in claim 5, further comprising:
a lead terminal for grounding the switching transistor chip; and
a lead terminal for grounding the control IC chip.

12. The output control device as set forth in claim 11, further comprising:
an island mounting the switching transistor chip and the control IC chip,
the lead terminal for grounding the switching transistor chip being connected to the island.

13. The output control device as set forth in claim 11, further comprising:
a transistor island mounting the switching transistor chip; and
a chip island mounting the control IC chip,
the lead terminal for grounding the switching transistor chip being connected to the transistor island.

14. The output control device as set forth in claim 5, wherein:
the switching transistor chip is thinner than the control IC chip.

15. The output control device as set forth in claim 5, wherein:
a backside of the switching transistor chip is die-bonded with an Ag paste.

16. The output control device as set forth in claim 5, wherein:
the control IC chip is coated with a resin having a low heat conductivity.

17. The output control device as set forth in claim 6, wherein:
the island includes a slit formed between the switching transistor chip and the control IC chip.

18. The output control device as set forth in claim 17, wherein:
a width of the slit is equal to or more than 0.5 mm.

19. The output control device as set forth in claim 17, wherein:
the lead terminal for grounding the switching transistor is connected to the island.

20. The output control device as set forth in claim 5, further comprising:
a transistor island mounting the switching transistor chip; and
a chip island mounting the control IC chip.

21. The output control device as set forth in claim 20, wherein:
a distance between the transistor island and the chip island is equal to or more than 0.5 mm.

22. The output control device as set forth in claim 5, wherein:
the switching transistor chip controls an output voltage of an AC/DC power source.

23. The output control device as set forth in claim 5, wherein:
the switching transistor chip controls an output current of an LED backlight circuit or a circuit having an LED as a load.

24. The output control device as set forth in claim 5, wherein:
the switching transistor chip controls an output voltage of a switching DC/DC converter.

25. An output control device comprising:
a switching transistor chip formed to control an output voltage or output current by having an on/off time ratio controlled;
a control IC chip formed to control the on/off time ratio of the switching transistor chip on the basis of the output voltage or output current controlled by the switching transistor chip;
a transistor island mounting the switching transistor chip;

a chip island mounting the control IC chip; and
a package containing the switching transistor chip and the control IC chip,
the switching transistor chip being composed of a vertical power MOSFET.

26. The output control device as set forth in claim 25, wherein:
a distance between the transistor island and the chip island is equal to or more than 0.5 mm.

27. The output control device as set forth in claim 25, wherein:
a distance dc between the switching transistor chip and the control IC chip satisfies:

$$dc \geq e0 \cdot em \cdot Sc \cdot (V/Vnc) \cdot BW \cdot Rc,$$

where:
e0 is a permittivity of vacuum;
em is a specific inductive capacity of a molding resin of the control IC chip;
Sc is a size of an area where the switching transistor chip and the control IC chip face each other;
V is a voltage amplitude of the switching transistor chip;
Rc is an impedance of a control circuit of the control IC chip;
BW is a bandwidth of the control circuit of the control IC chip; and
Vnc is a voltage amplitude of noise permissible in the control circuit of the control IC chip.

28. The output control device as set forth in claim 25, further comprising:
a lead terminal connected to either one of the transistor island and the chip island.

29. The output control device as set forth in claim 25, wherein:
the control IC chip includes a digital circuit and an analog circuit that is provided on a side opposite to the switching transistor chip with respect to the digital circuit.

30. The output control device as set forth in claim 25, further comprising:
a lead terminal for grounding the switching transistor chip; and
a lead terminal for grounding the control IC chip.

31. The output control device as set forth in claim 25, wherein:
the switching transistor chip is thinner than the control IC chip.

32. The output control device as set forth in claim 25, wherein:
the control IC chip is coated with a resin having a low heat conductivity.

33. The output control device as set forth in claim 25, wherein:
the switching transistor controls an output voltage of an AC/DC power source.

34. The output control device as set forth in claim 25, wherein:
the switching transistor controls an output current of an LED backlight circuit or a circuit having an LED as a load.

35. The output control device as set forth in claim 25, wherein:
the switching transistor controls an output voltage of a switching DC/DC converter.

36. An AC/DC power source device using an output control device as set forth in claim 1.

37. A circuit device having an LED as a load which circuit uses an output control device as set forth in claim 1.

38. An LED backlight circuit device using an output control device as set forth in claim 1.

39. A switching DC/DC converter device using an output control device as set forth in claim 1.

* * * * *